(12) United States Patent
Chang

(10) Patent No.: US 12,433,144 B2
(45) Date of Patent: Sep. 30, 2025

(54) ELECTRODE CONNECTION STRUCTURE AND METHOD OF FORMING THE SAME

(71) Applicant: Raynergy Tek Incorporation, Hsinchu (TW)

(72) Inventor: Yi-Ming Chang, Hsinchu (TW)

(73) Assignee: Raynergy Tek Incorporation, Hsinchu (TW)

( * ) Notice: Subject to any disclaimer, the term of this patent is extended or adjusted under 35 U.S.C. 154(b) by 564 days.

(21) Appl. No.: 17/879,903

(22) Filed: Aug. 3, 2022

(65) Prior Publication Data

US 2023/0371352 A1    Nov. 16, 2023

(30) Foreign Application Priority Data

May 13, 2022   (TW) .................................. 111118137

(51) Int. Cl.
| | | |
|---|---|---|
| *H10K 71/00* | (2023.01) | |
| *H01G 9/00* | (2006.01) | |
| *H01G 9/20* | (2006.01) | |
| *H10H 29/14* | (2025.01) | |
| *H10K 39/00* | (2023.01) | |
| *H10K 59/12* | (2023.01) | |
| *H10K 59/131* | (2023.01) | |

(52) U.S. Cl.
CPC ........... *H10K 71/00* (2023.02); *H01G 9/0029* (2013.01); *H01G 9/2068* (2013.01); *H10H 29/142* (2025.01); *H10K 39/00* (2023.02); *H10K 59/131* (2023.02); *H10K 59/1201* (2023.02)

(58) Field of Classification Search
CPC ...... H10K 71/00; H10K 39/00; H10K 59/131; H10K 59/1201; H10K 59/805; H10K 30/81–83; H01G 9/0029; H01G 9/2068; H10H 29/142; H10H 20/8312; H10H 20/83–835; H10F 77/206; H10F 77/244–254; H10F 71/138–1385

See application file for complete search history.

(56) References Cited

U.S. PATENT DOCUMENTS

| | | | | |
|---|---|---|---|---|
| 10,748,881 | B2 * | 8/2020 | Kim | ..................... H10H 20/857 |
| 10,862,006 | B2 * | 12/2020 | Jang | ..................... H10H 20/813 |
| 11,569,182 | B2 * | 1/2023 | Piedra | .................. H10D 30/675 |
| 2010/0207112 | A1 | 8/2010 | Fürst et al. | |

(Continued)

FOREIGN PATENT DOCUMENTS

| | | | | | |
|---|---|---|---|---|---|
| CN | 110832635 A | * | 2/2020 | ......... | H01L 21/6835 |
| CN | 111341853 A | * | 6/2020 | ............. | H10F 71/00 |

(Continued)

*Primary Examiner* — Scott B Geyer
(74) *Attorney, Agent, or Firm* — Joseph C. Zucchero; Carolyn S. Elmore; Elmore Patent Law Group, P.C.

(57) ABSTRACT

An electrode connection structure is provided and includes a substrate, a first electrode, a second electrode, a semiconductor layer, a third electrode, and a conductive block. The first electrode and the second electrode are located on the substrate. The semiconductor layer is located on the first electrode and the second electrode. The third electrode is on the semiconductor layer. The conductive block penetrates through the semiconductor layer and the third electrode and directly contacts the second electrode and the third electrode. A first upper surface of the conductive block and a second upper surface of the third electrode are in different planes.

15 Claims, 11 Drawing Sheets

(56) References Cited

U.S. PATENT DOCUMENTS

| | | | |
|---|---|---|---|
| 2010/0314666 A1* | 12/2010 | Saito | H10D 62/106 |
| | | | 257/E29.091 |
| 2015/0014628 A1* | 1/2015 | Chung | H01L 25/074 |
| | | | 438/26 |
| 2015/0145082 A1* | 5/2015 | Lee | H10F 77/14 |
| | | | 257/432 |
| 2015/0371986 A1* | 12/2015 | Pan | H10D 84/811 |
| | | | 257/195 |
| 2017/0155004 A1* | 6/2017 | Phoa | H02S 40/38 |
| 2017/0309676 A1* | 10/2017 | Odnoblyudov | H10D 86/201 |
| 2018/0145119 A1 | 5/2018 | Choi et al. | |
| 2018/0286922 A1* | 10/2018 | Togashi | H10F 39/199 |
| 2019/0057996 A1* | 2/2019 | Oshige | H10F 39/011 |
| 2020/0153071 A1* | 5/2020 | Cui | H01L 21/6835 |
| 2020/0402728 A1* | 12/2020 | Liao | H01G 9/0036 |
| 2022/0085795 A1* | 3/2022 | Soric | H10D 62/8503 |
| 2022/0231157 A1* | 7/2022 | Wu | H10D 64/411 |
| 2024/0021767 A1* | 1/2024 | Kono | H01L 25/167 |

FOREIGN PATENT DOCUMENTS

| | | | | | |
|---|---|---|---|---|---|
| CN | 111508989 A | * | 8/2020 | ......... | H01L 25/0753 |
| CN | 114127976 A | | 3/2022 | | |
| GB | 2554422 A | | 4/2018 | | |
| JP | 2005340571 A | | 12/2005 | | |
| JP | 2007095659 A | | 4/2007 | | |
| JP | 2010278148 A | | 12/2010 | | |
| JP | 2012084371 A | | 4/2012 | | |
| JP | 2013020778 A | | 1/2013 | | |
| JP | 2013211473 A | | 10/2013 | | |
| JP | 2014192196 A | | 10/2014 | | |
| JP | 2016201216 A | | 12/2016 | | |
| JP | 2018097361 A | | 6/2018 | | |
| JP | 2018098495 A | | 6/2018 | | |
| KR | 20150078296 A | * | 7/2015 | ........... | H10H 20/857 |
| KR | 102170243 B1 | * | 10/2020 | ........... | H10H 20/857 |
| KR | 20210125580 A | * | 10/2021 | ........... | H10H 20/833 |
| WO | 2020188777 A1 | | 9/2020 | | |

\* cited by examiner

ELECTRODE CONNECTION STRUCTURE AND METHOD OF FORMING THE SAME

CROSS-REFERENCE TO RELATED APPLICATION

The application claims priority to Taiwan Application Serial Number 111118137, filed May 13, 2022, which is herein incorporated by reference in its entirety.

BACKGROUND

Field of Invention

The present disclosure relates to an electrode connection structure and a forming method thereof.

Description of Related Art

Devices with an active matrix to drive or read signals have many applications, such as active-matrix organic light-emitting diodes (AMOLED) and photodiode-based image sensors. However, with the gradual miniaturization of photodiodes in the semiconductor industry, good photodiodes need to avoid short circuits caused by contact between electrodes, and also need to remove the material at the connection between the electrodes and external wires to avoid the formation of too high resistance between the electrodes and external wires to affect the current generation.

In addition, the selection of photodiode materials has also developed from previous silicon-based materials to organic semiconductor materials, quantum dot materials, or perovskite materials. The structure of the photodiodes has also changed to bottom-to-top layer stacking corresponding to the change of materials. However, the photoresist chemicals used in this manufacturing process may be incompatible with emerging organic semiconductor materials, quantum dot materials, or perovskite materials. For example, polar solvents used in the lithography process may decompose perovskite materials, making it difficult to pattern photodiodes based on perovskite materials. It is hard to obtain photodiodes with a good electrode connection structure. Therefore, how to obtain a photodiode with a good electrode connection structure and a manufacturing process compatible with the current technology is a problem that must be solved.

SUMMARY

The present disclosure relates to an electrode connection structure. In some embodiments, the electrode connection structure includes a substrate, a first electrode, a semiconductor layer, a third electrode, and a conductive block. The first electrode and the second electrode are located on the substrate. The semiconductor layer is located on the first electrode and the second electrode. The third electrode is located on the semiconductor layer. The conductive block penetrates through the semiconductor layer and the third electrode and directly contacts the second electrode and the third electrode. The first upper surface of the conductive block and the second upper surface of the third electrode are in different planes.

In some embodiments, the conductive block further includes an extended portion covering the second upper surface of the third electrode.

In some embodiments, the semiconductor layer includes a photoactive layer, a carrier transport layer, or a combination thereof. The material of the photoactive layer includes an organic semiconductor, a quantum dot, a perovskite, or combinations thereof.

In some embodiments, the first upper surface of the conductive block is higher than the second upper surface of the third electrode.

In some embodiments, the material of the conductive block is the same as the material of the third electrode.

In some embodiments, the material of the conductive block is different from the material of the third electrode.

In some embodiments, the electrode connection structure includes a package layer. The package layer is disposed on the third electrode, a conductive block, and an edge portion of the substrate to completely cover the third electrode, the conductive block, and the semiconductor layer.

The present disclosure relates to a method of forming an electrode connection structure. In some embodiments, the method includes the following operations: forming a first electrode and a second electrode on a substrate, forming a semiconductor layer on the first electrode and the second electrode, forming a third electrode on the semiconductor layer, forming a through-hole penetrating through the third electrode and the semiconductor layer to expose the second electrode, and depositing a conductive block in the through-hole. The conductive block directly contacts the second electrode and the third electrode. The first upper surface of the conductive block and the second upper surface of the third electrode are in different planes.

In some embodiments, forming the through-hole penetrating through the third electrode and the semiconductor layer to expose the second electrode includes forming a photoresist layer on the third electrode, patterning the photoresist layer to form an opening exposing the third electrode, etching the third electrode in the opening and the semiconductor layer below the third electrode to form the through-hole, and removing the photoresist layer.

In some embodiments, forming the through-hole penetrating through the third electrode and the semiconductor layer to expose the second electrode includes removing a portion of the third electrode and a portion of the semiconductor layer with a laser to form the through-hole.

In some embodiments, the method further includes forming a mask on a portion of the semiconductor layer before forming the third electrode on the semiconductor layer, in which forming the through-hole penetrating through the third electrode and the semiconductor layer to expose the second electrode includes the following operations: removing the mask, in which the third electrode has an opening exposing the portion of the semiconductor layer, forming a patterned photoresist layer on the third electrode, the patterned photoresist layer has an opening communicating with the opening of the third electrode, etching or striping the portion of the semiconductor layer in the opening of the third electrode to form the through-hole, and removing the patterned photoresist layer.

In some embodiments, the method further includes forming a mask on a portion of the semiconductor layer before forming the third electrode on the semiconductor layer, in which forming the through-hole penetrating through the third electrode and the semiconductor layer to expose the second electrode includes the following operations: removing the mask, in which the third electrode has an opening exposing the portion of the semiconductor layer, and removing the portion of the semiconductor layer in the opening of the third electrode with a laser to form the through-hole.

In some embodiments, depositing the conductive block in the through-hole includes forming a mask with an opening exposing the through-hole on the third electrode, depositing the conductive block in the through-hole, and removing the mask.

In some embodiments, depositing the conductive block in the through-hole includes forming a photoresist layer on the third electrode and in the through-hole, patterning the photoresist layer to form an opening exposing the through-hole, depositing the conductive block in the through-hole, and removing the photoresist layer.

In some embodiments, the semiconductor layer includes a photoactive layer, a carrier transport layer, or a combination thereof, and the material of the photoactive layer includes an organic semiconductor, a quantum dot, a perovskite, or combinations thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale and are used for illustration purposes only. The dimensions of the various features may be arbitrarily increased or reduced for clarity of discussion.

DETAILED DESCRIPTION

Figure 1A:
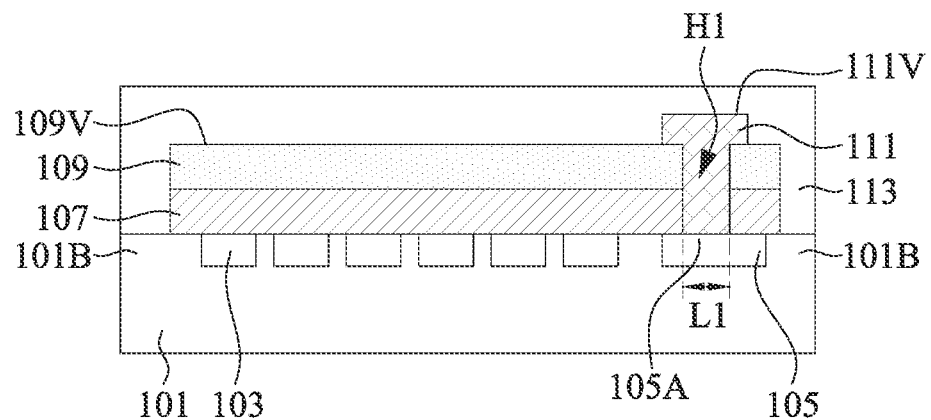
FIGS. 1A-1B are cross sectional views of an electrode connection structure according to some embodiments of the present disclosure.

The following disclosure provides different embodiments for different features of the provided subject matter. Specific examples of elements and arrangements are described below to simplify the present disclosure. These are merely examples and are not intended to be limiting. For example, the description of the formation of a first feature on a second feature may include embodiments in which the first and second features are formed in direct contact and may also include embodiments in which additional features may be formed between the first and second features, such that the first and second features may not be in direct contact.

Further, spatially relative terms, such as "beneath", "below", "lower", "above", "upper", "top", "bottom", and the like, may be used herein for ease of description to describe one element's or feature's relationship to another element(s) or feature(s) as shown in the figures. The spatially relative terms are intended to encompass different orientations of the element in use or operation in addition to the orientation depicted in the figures. The apparatus may be otherwise oriented (rotated 90 degrees or at other orientations) and the spatially relative descriptors used herein may likewise be interpreted accordingly. In the discussion herein, unless otherwise indicated, the same reference numerals in different figures refer to the same or similar elements formed by the same or similar methods or using the same or similar materials.

The present disclosure provides an electrode connection structure including a substrate, a first electrode, a semiconductor layer, a third electrode, and a conductive block. The first electrode and the second electrode are located on the substrate. The semiconductor layer is located on the first electrode and the second electrode. The third electrode is located on the semiconductor layer. The conductive block penetrates through the semiconductor layer and the third electrode and directly contacts the second electrode and the third electrode. The first upper surface of the conductive block and the second upper surface of the third electrode are in different planes. The electrode connection structure of the present disclosure will be described in detail below according to embodiments.

Figure 1B:
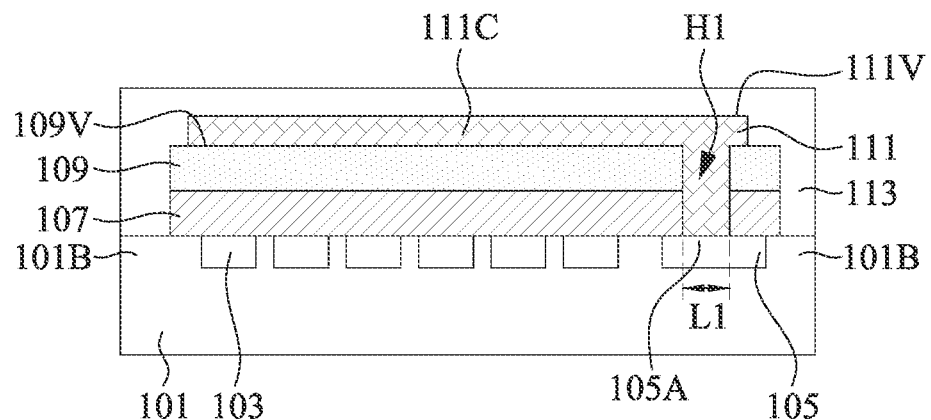

FIGS. 1A-1B are cross sectional views of the electrode connection structure according to some embodiments of the present disclosure, for example, the cross sectional views of an electrode connection structure in a photodiode. In the embodiments shown in FIGS. 1A-1B, the electrode connection structure includes a substrate 101, a first electrode 103, a second electrode 105, a semiconductor layer 107, a third electrode 109, a conductive block 111, a package layer 113, and a through-hole H1. In some embodiments, the semiconductor layer 107 of the present disclosure includes materials of an organic semiconductor, a quantum dot, a perovskite, or combinations thereof, which are incompatible with the chemicals used in current lithography process and can only be formed by a solution-type process. For example, the semiconductor layer 107 of the present disclosure includes a perovskite quantum dot material that is susceptible to decomposition in polar solvents of a lithography process. That is, the semiconductor layer 107 of the present disclosure has the characteristic of being difficult to be patterned by a lithography etching process. However, with the electrode connection structure formed by the following method of forming an electrode connection structure, the semiconductor layer 107 is patterned without damaging the characteristics of the semiconductor layer 107. For example, a pattern of the through-hole H1 is formed so that the conductive block 111 substantially completely fills the through-hole H1 and is well connected to the third electrode 109 and the second electrode 105. Therefore, there will not be semiconductor layer 107 located in the through-hole H1 due to incomplete patterning, which causes problems of too high resistance and affects the current generation. The material of the conductive block 111 can be not only the same as the material of the third electrode 109, but also different from the material of the third electrode 109. Moreover, the first upper surface 111V of the conductive block 111 is higher than the second upper surface 109V of the third electrode 109.

Next, the electrode connection structure shown in FIGS. 1A-1B will be described in detail. In some embodiments, the substrate 101 is a transparent substrate such as flexible polyethylene terephthalate (PET), polyethylene naphthalate (PEN), polyimide (PI), or for example, a non-flexible glass substrate or a wafer substrate (silicon wafer). In some embodiments, the substrate 101 is a thin film transistor (TFT) substrate. In some embodiments, the substrate 101 is a complementary metal-oxide semiconductor (CMOS) substrate. In some embodiments, the substrate 101 is a circuit. In the embodiment shown in FIGS. 1A-1B, the first electrode 103 and the second electrode 105 are located on the substrate 101 and are spaced apart from each other. The first electrode 103 and the second electrode 105 are embedded in the substrate 101, so the upper surface formed by the first electrode 103, the second electrode 105, and the substrate 101 is substantially flat, which is beneficial for forming a semiconductor layer 107 on such a relatively flat surface. In some embodiments, the first electrode 103 is a unit electrode, and there may be a plurality of them as shown in FIGS. 1A-1B, and they are separated from each other and correspond to the positions of the pixels in the semiconductor layer 107 in an arrangement such as arrays.

Continue to refer to FIGS. 1A-1B. The semiconductor layer 107 is located on the first electrode 103 and the second electrode 105. The semiconductor layer 107 includes a photoactive layer and necessary multiple layers of carrier transport layers (not shown). The material of the photoactive layer includes an organic semiconductor, a quantum dot, a perovskite, or combinations thereof. For example, the material is a perovskite quantum dot having a general formula $ABX_3$, where A can be formamidinium (FA), methylammonium (MA), cesium, or combinations thereof; B can be lead, tin, or a combination thereof; and X can be a halogen, or for example, the material is an organic semiconductor layer, such as P3HT:PCBM, PTB7:PCBM, PM6:Y6, conjugated polymer: fullerene derivative, conjugated polymer: non fullerene acceptor, conjugated polymer: conjugated polymer, conjugated small molecule: conjugated small molecule, conjugated small molecule: conjugated polymer, or other combinations, but not limited thereto. The material may be quantum dot materials such as CdSe, CdS, ZnS, InP, PbS, etc., but not limited thereto as well. Or an organic semiconductor in a light-emitting type, such as MEH-PPV, but not limited thereto as well. The materials of these photoactive layers have excellent photoelectric conversion efficiency. However, due to own properties of these materials, they are often formed on the first electrode 103 and the second electrode 105 by a solution-type process such as spin coating. In some embodiments, the semiconductor layer 107 is not limited to a single layer. For example, it may be a stack structure having multiple layers, and in the stack structure, carrier transport layers are respectively disposed above and below a photoactive layer to help collect electrons and holes to the first electrode 103 and the third electrode 109.

Continue to refer to FIGS. 1A to 1B. The third electrode 109 is located on the semiconductor layer 107 and is spatially separated from the first electrode 103 below by the semiconductor layer 107 to avoid a short circuit caused by direct contact with the first electrode 103. In some embodiments, the third electrode 109 is a common electrode of the pixels in the semiconductor layer 107 compared to the unit electrodes arranged corresponding to the pixel positions in the semiconductor layer 107, such as the first electrode 103 shown in FIG. 1A to FIG. 1B. In some embodiments, the materials of the first electrode 103, the second electrode 105, and the third electrode 109 can be metals, such as aluminum, silver, molybdenum, copper, titanium, titanium nitride (TiN), etc.; metal oxides, such as indium tin oxide (ITO), etc.; carbon-based materials, such as carbon nanotubes, etc.; and organic conductive materials, etc. In some embodiments, the first electrode 103 acts as an anode, and the third electrode 109 acts as a cathode, or the first electrode 103 acts as a cathode, and the third electrode 109 acts as an anode. The anode and cathode are connected to a voltage source (not shown), and in some embodiments, they are used to collect the current generated by the semiconductor layer 107. In some embodiments, the transistor circuits and capacitors are disposed within the substrate 101.

Continue to refer to FIGS. 1A to 1B. The conductive block 111 penetrates through the semiconductor layer 107 and the third electrode 109 and directly contacts the portion 105A of the second electrode 105 and the third electrode 109 so that the third electrode 109 is connected to the portion 105A of the second electrode 105 through the conductive block 111. In some embodiments, the third electrode 109 is used as a connection electrode through the second electrode 105, and is connected to, for example, a driving or reading circuit in the substrate 101 to form a complete electrical circuit. It should be noted that the conductive block 111 substantially completely fills the through-hole H1, and there is no semiconductor layer 107 located in the through-hole H1. Therefore, the conductive block 111 is well connected to the third electrode 109 and the portion 105A of the second electrode 105, and there is no semiconductor layer 107 located in the through-hole H1. Since there is no semiconductor layer 107 located in the through-hole H1, the resistance will not be too high, thereby affecting the current generation. In some embodiments, the material of the conductive block 111 may be metal, such as aluminum, silver, molybdenum, copper, titanium, titanium nitride (TiN), etc.; metal oxide, such as indium tin oxide (ITO), etc.; carbon-based material, such as carbon nanotubes, etc.; and organic conductive materials. In some embodiments, the material of the conductive block 111 is the same as the material of the third electrode 109. In some embodiments, the material of the conductive block 111 is different from the material of the third electrode 109. However, it should be noted that, regardless of whether the material of the conductive block 111 and the material of the third electrode 109 are the same or different, the conductive block 111 and the third electrode 109 are not integrally formed so that, for example, the first upper surface 111V of the conductive block 111 and the second upper surface 109V of the third electrode 109 are not in the same plane. The difference between FIG. 1A and FIG. 1B is the conductive block 111 of FIG. 1B further includes an extended portion 111C covering the second upper surface 109V of the third electrode 109 and located on the first electrode 103.

Continue to refer to FIGS. 1A-1B. A package layer 113 is formed on the third electrode 109, conductive block 111, and the edge portion 101B of the substrate 101 to completely cover the third electrode 109, the conductive block 111, and the semiconductor layer 107. The package layer 113 prevents outside oxygen or moisture from penetrating into the electrode connection structure to cause oxidation of the electrodes (e.g., the third electrode 109 etc.) or oxidation of the photoactive layer in the semiconductor layer 107, which affects normal operation of the function. In some embodiments, the material of the package layer 113 is silicon nitride, silicon oxynitride, silicon oxide, epoxy resin etc., or combinations thereof. It should be noted that the package layer 113 directly contacts the edge portion 101B of the substrate 101, and there is substantially no semiconductor layer 107 between the package layer 113 and the edge portion 101B of the substrate 101. Therefore, the package layer 113 provides a complete coverage.

The above electrode connection structure includes a semiconductor layer 107 that can only be formed by a solution-type coating process due to its material properties. Also, due to its incompatibilities with the chemicals used in the current lithography process, it is difficult for the semiconductor layer 107 to be patterned by forming a photoresist layer thereon. However, the above electrode connection structure has a through-hole H1 penetrating the semiconductor layer 107, such that the conductive block 111 in the through-hole H1 can be connected well with the portion 105A of the second electrode 105 (meaning that there is substantially no semiconductor layer 107 between the conductive block 111 and the portion 105A of the second electrode 105). The above electrode connection structure has the above characteristics even after miniaturization. For example, the through-hole H1 filled with the conductive block 111 has only a micrometer scale.

The present disclosure provides a method of forming an electrode connection structure. In some embodiments, the method includes the following operations: forming a first electrode and a second electrode on a substrate, forming a semiconductor layer on the first electrode and the second electrode, forming a third electrode on the semiconductor layer, forming a through-hole penetrating through the third electrode and the semiconductor layer to expose the second electrode, and depositing a conductive block in the through-hole. The conductive block directly contacts the second electrode and the third electrode. The first upper surface of the conductive block and the second upper surface of the third electrode are in different planes. The method of forming an electrode connection structure of the present disclosure will be described in detail below according to embodiments.

Figure 3A:
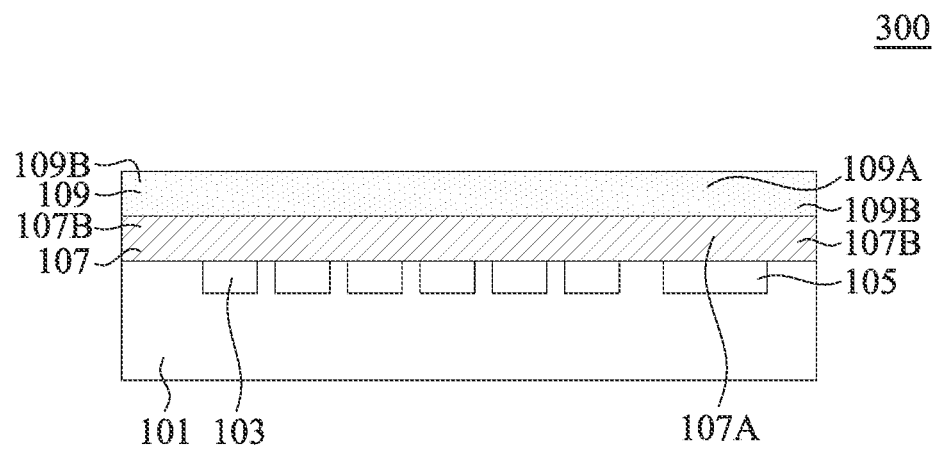
FIGS. 3A-3B are cross-sectional views of intermediate stages of forming an electrode connection structure according to some embodiments of the present disclosure.
Figure 3B:
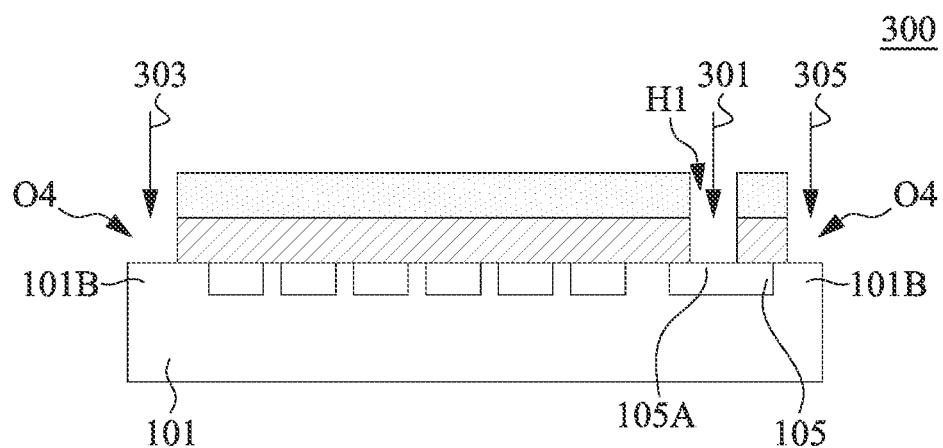
Figure 4A:
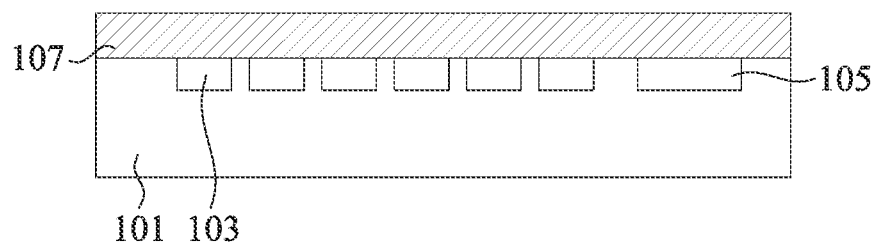
FIGS. 4A-4E are cross-sectional views of intermediate stages of forming an electrode connection structure according to some embodiments of the present disclosure.

FIGS. 2A-2E are cross-sectional views of intermediate stages of forming an electrode connection structure according to some embodiments of the present disclosure. FIGS. 3A-3B are cross-sectional views of intermediate stages of forming an electrode connection structure according to some embodiments of the present disclosure. FIGS. 4A-4E are cross-sectional views of intermediate stages of forming an electrode connection structure according to some embodiments of the present disclosure. FIGS. 5A-5C are cross-sectional views of intermediate stages of forming an electrode connection structure according to some embodiments of the present disclosure. An electrode connection structure 200, an electrode connection structure 300, an electrode connection structure 400, and an electrode connection structure 500 formed by the method of present disclosure substantially have final structures same as that shown in FIG. 1A or FIG. 1B but have different intermediate stages. The same reference numerals are referred to the substantially same materials formed by the substantially same forming method; therefore, the relevant details will not be repeated below. The present disclosed forming method of an electrode connection structure includes patterning the semiconductor layer 107 that is difficult to be compatible with the chemicals of the current lithography process and can only be formed by a solution-type process. By forming a third electrode 109 directly on the semiconductor layer 107, making the two in direct contact, then patterning the third electrode 109 and the semiconductor layer 107 or patterning the third electrode 109 and the semiconductor layer 107 at the same time, a through-hole H1 penetrating through the third electrode 109 and the semiconductor layer 107 can be obtained. The through-hole H1 exposes the portion 105A of the second electrode 105, and there is substantially no semiconductor layer 107 remained on the portion 105A of the second electrode 105. Therefore, the conductive block 111 subsequently deposited in the through-hole H1 is well connected to the second electrode 105 and the third electrode 109. There is no residual semiconductor layer 107 to cause too high resistance and affect the current generation. That is to say, even if the semiconductor layer 107 of the present disclosure can only be formed by a solution-type process and is incompatible with the chemicals used in the current lithography process, the semiconductor layer 107 can still be patterned by the method of the present disclosure, according to a desired pattern, such as the through-hole H1 mentioned above.

Figure 2A:
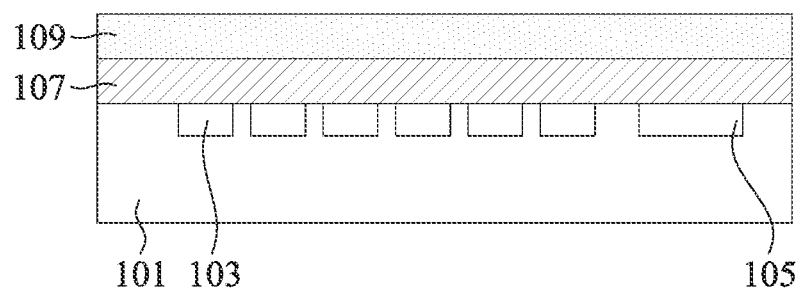
FIGS. 2A-2E are cross-sectional views of intermediate stages of forming an electrode connection structure according to some embodiments of the present disclosure.
Figure 2B:
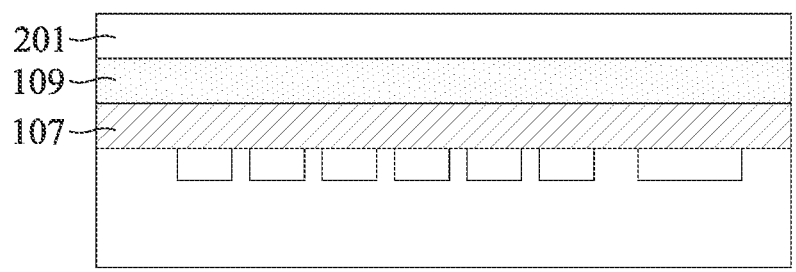
Figure 2C:
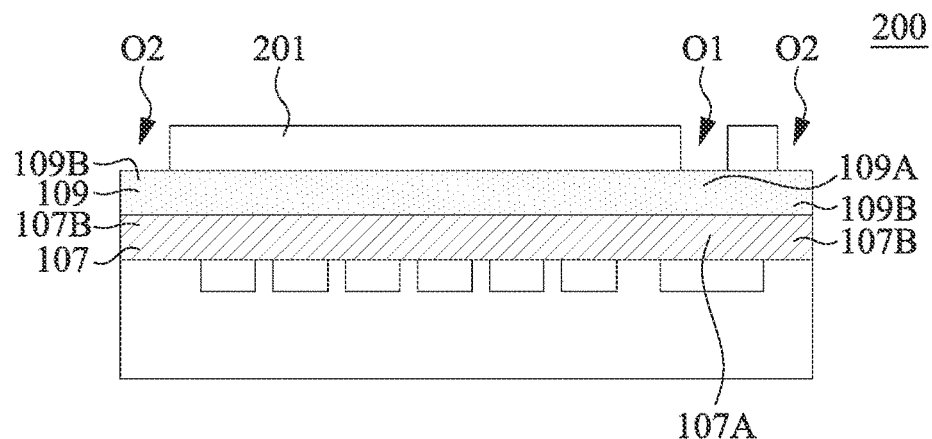

Next, the cross-sectional views of intermediate stages of forming an electrode connection structure of FIGS. 2A-2E are described in detail. In FIG. 2A, a first electrode 103 and a second electrode 105 are formed on substrate 101, in which the first electrode 103 and the second electrode 105 are spaced apart from each other and embedded in substrate 101. In some embodiments, a plurality of first electrode 103 are separated from each other and correspond to the positions of the pixels in the semiconductor layer 107 formed thereon in a subsequent process in such as an array arrangement. Next, a semiconductor layer 107 is formed on the first electrode 103, the second electrode 105, and the substrate 101 by, for example, spin coating. Then, a third electrode 109 is formed on the semiconductor layer 107. In some embodiments, the third electrode 109 is in direct contact with the semiconductor layer 107.

Figure 2D:
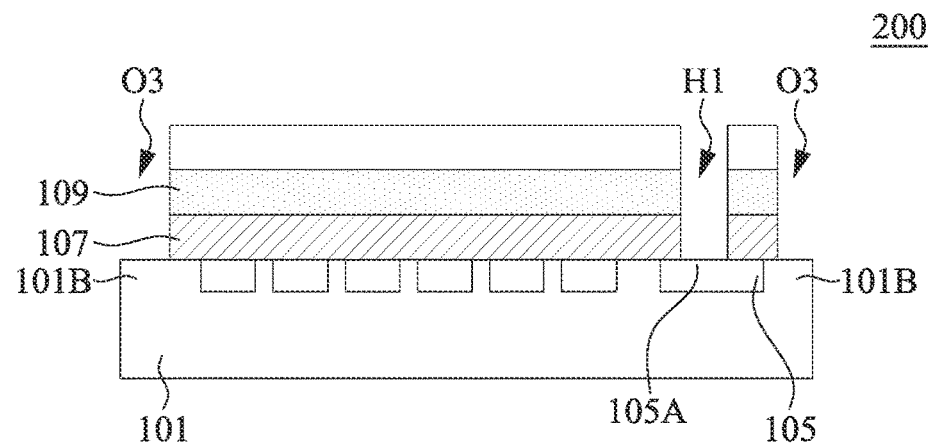

In FIGS. 2B-2E, a through-hole H1 is formed to penetrate through the third electrode 109 and the semiconductor layer 107 to expose the second electrode 105. In detail, in FIG. 2B, a photoresist layer 201 is formed on the third electrode 109, and the third electrode 109 does not have compatibility problems with the photoresist layer 201 (such as mutual dissolution or chemical reaction). Thus the semiconductor layer 107 and the photoresist layer 201, which have compatibility issues, can be spatially separated. In some embodiments, the photoresist layer 201 direct contacts the third electrode 109. Next, in FIG. 2C, the photoresist layer 201 is patterned to form an opening O1 exposing the portion 109A of the third electrode 109 and an opening O2 exposing the edge portion 109B of the third electrode 109. The opening O1 defines the location where the conductive block 111 is deposited and filled in the subsequent process. The opening O2 defines the location where the package layer 113 is deposited and filled in the subsequent process. In FIG. 2D, also refer to FIG. 2C, the portion 109A of the third electrode 109 in the opening O1 and the portion 107A of the semiconductor layer 107 below are etched to form a through-hole H1. The edge portion 109B of the third electrode 109 and the edge portion 107B of the semiconductor layer 107 below are etched to form a deeper opening O3. The through-hole H1 exposes the portion 105A of the second electrode 105, and the opening O3 exposes the edge portion 101B of the substrate 101. Then, in FIG. 2E, the photoresist layer 201 of FIG. 2D is removed.

Figure 2E:
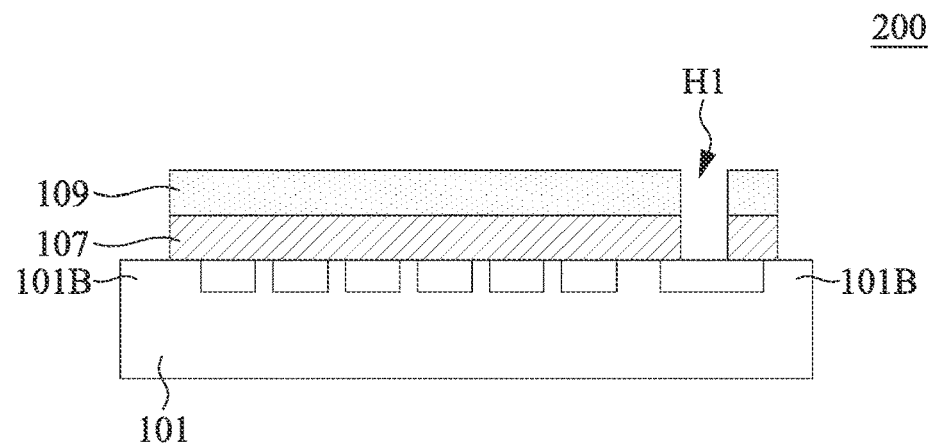

Refer to FIG. 2E, FIG. 1A, and FIG. 1B. In the embodiment shown in FIG. 2E, a conductive block 111 is deposited in the through-hole H1. Next, a package layer 113 is deposited on the third electrode 109, the conductive block 111, and the edge portion 101B of the substrate 101 to obtain the electrode connection structure shown in FIG. 1A or FIG. 1B. Refer to FIG. 6 to FIG. 9C below for details of the intermediate process of depositing a conductive block 111 in the through-hole H1. The formed conductive block 111 directly contacts the second electrode 105 and the third electrode 109 and has a good electrode connection and a feature that the first upper surface 111V and the second upper surface 109V of the third electrode are not in the same plane (as shown in FIG. 1A or FIG. 1B).

Next, the intermediate stage cross-sectional views of forming an electrode connection structure 300 of FIG. 3A to FIG. 3B will be described in detail. In FIG. 3A, a first electrode 103 and a second electrode 105 are formed on a substrate 101, a semiconductor layer 107 is formed on the first electrode 103, the second electrode 105, and the substrate 101; and a third electrode 109 is formed on the semiconductor layer 107. Refer to the embodiment of FIG. 2A for the embodiment of FIG. 3A, which will not be repeated here.

In FIG. 3B, a through-hole H1 is formed to penetrate through the third electrode 109 and the semiconductor layer 107 to expose the second electrode 105. In detail, a laser 301 is used to simultaneously remove the portion 109A of the third electrode 109 and the portion 107A of the semiconductor layer 107 to form a through-hole H1. A laser 303 and a laser 305 are used to simultaneously remove the edge portion 109B of the third electrode 109 and the edge portion 107B of the semiconductor layer 107 to form an opening O4. Using laser lift-off can avoid performing patterning with a photoresist layer that is incompatible with the semiconductor layer 107. Using the laser 301 to simultaneously remove the portion 109A of the third electrode 109 and the portion 107A of the semiconductor layer 107, and using the laser 303 and the laser 305 to simultaneously remove the edge portion 109B of the third electrode 109 and the edge portion 107B of the semiconductor layer 107 can also ensure obtaining a through-hole H1 simultaneously penetrating through the third electrode 109 and the semiconductor layer 107 and obtaining an opening O4 aligned with the portion 105A of the second electrode 105 and the edge portion 101B of the substrate 101. That is to say, the through-hole H1 exposes the portion 105A of the second electrode 105, and the opening O4 exposes the edge portion 101B of the substrate 101.

Refer to FIG. 3B, FIG. 1A, and FIG. 1B. In the embodiment shown in FIG. 3B, a conductive block 111 is deposited in the through-hole H1, and a package layer is deposited on the third electrode 109, the conductive block 111, and the edge portion 101B of the substrate 101 to obtain the electrode connection structure shown in FIG. 1A or FIG. 1B. Refer to FIG. 6 to FIG. 9C for details of the intermediate process of depositing a conductive block 111 in the through-hole H1. The formed conductive block 111 directly contacts the second electrode 105 and the third electrode 109 and has a good electrode connection and a feature that the first upper surface 111V and the second upper surface 109V of the third electrode are not in the same plane (as shown in FIG. 1A or FIG. 1B).

Next, the intermediate stage cross-sectional views of forming an electrode connection structure 400 of FIGS. 4A-4E will be described in detail. In FIG. 4A, a first electrode 103 and a second electrode 105 are formed on a substrate 101, and a semiconductor layer 107 is formed on the first electrode 103, the second electrode 105, and the substrate 101. Refer to the above embodiments of FIG. 2A for the embodiments of FIG. 4A, which will not be repeated here.

Figure 4B:
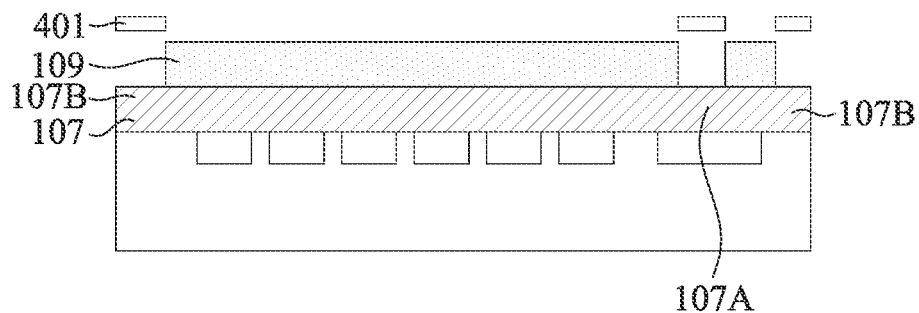
Figure 4C:
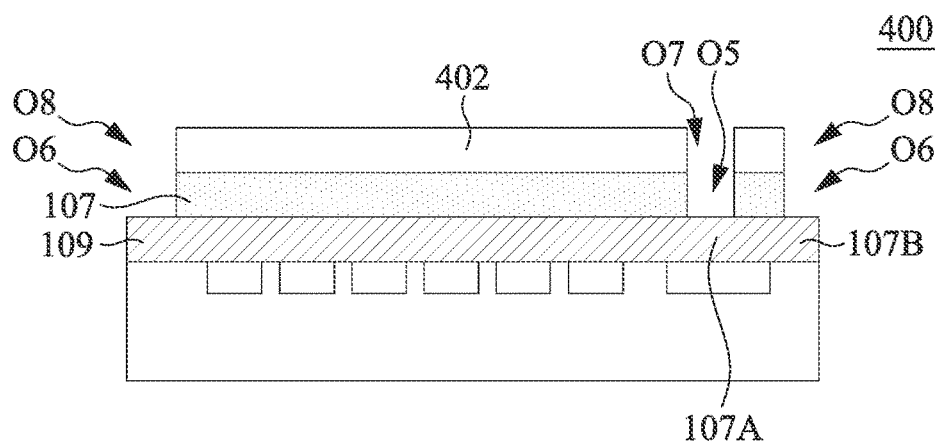
Figure 4D:
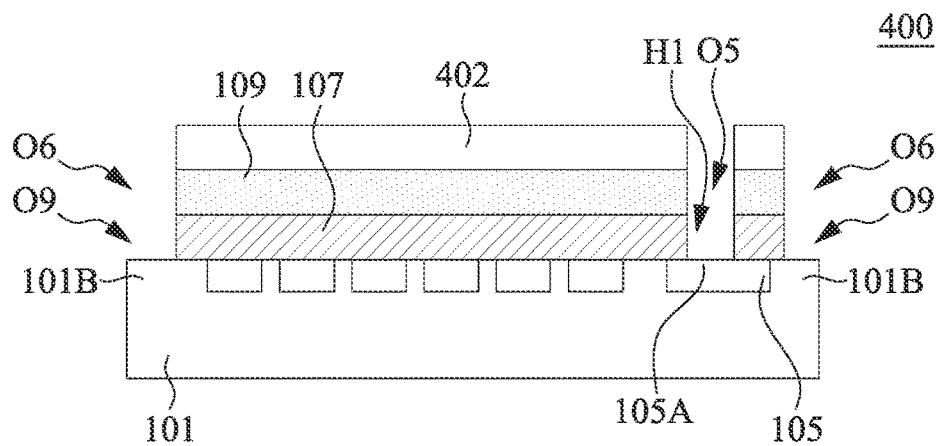
Figure 4E:
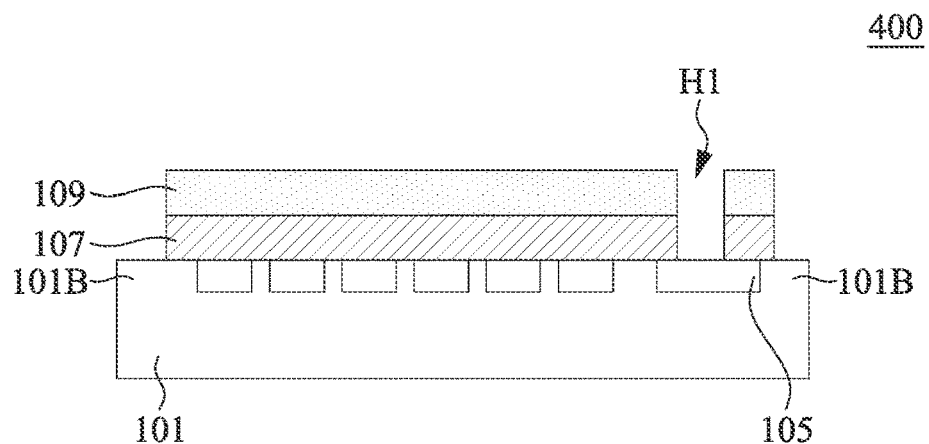
Figure 5A:
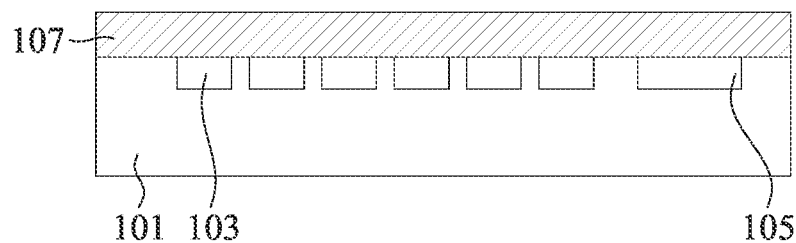
FIGS. 5A-5C are cross-sectional views of intermediate stages of forming an electrode connection structure according to some embodiments of the present disclosure.
Figure 5B:
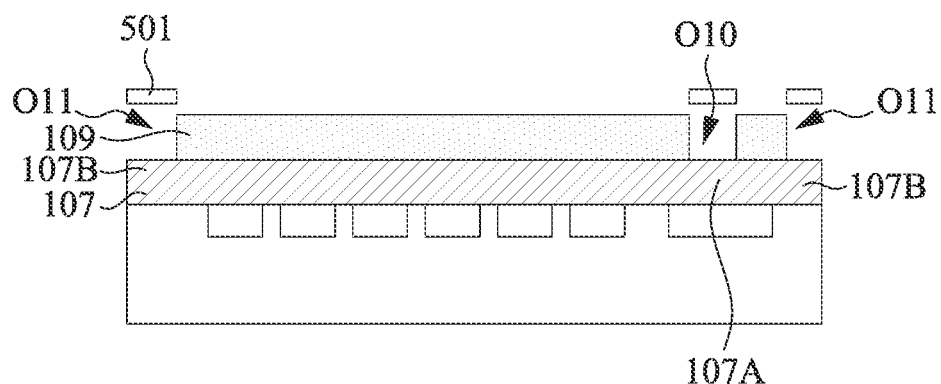
Figure 5C:
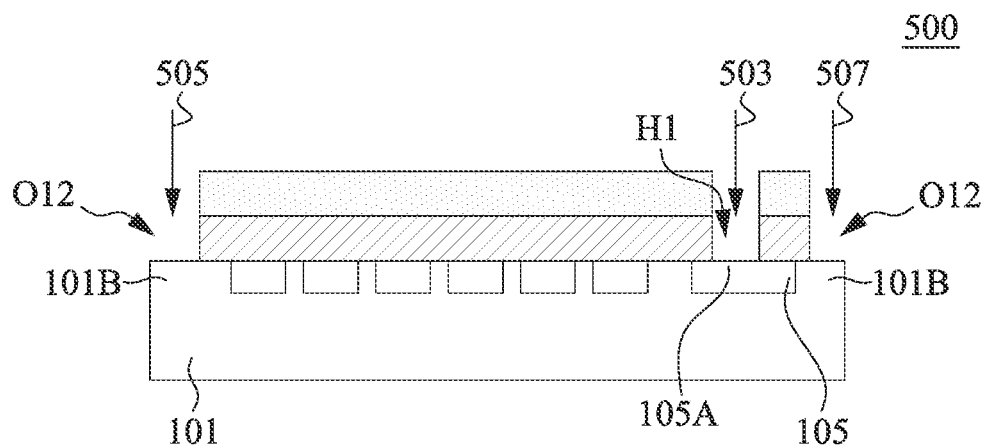

In FIGS. 4B-4E, a through-hole H1 is formed to penetrate through the third electrode 109 and a semiconductor layer 107 to expose a second electrode 105. In FIG. 4B, before forming a third electrode 109 on the semiconductor layer 107, it further includes forming a mask 401 on the portion 107A and the edge portion 107B of the semiconductor layer 107 to respectively define the location where a conductive block 111 is deposited and filled and where a package layer 113 is deposited and filled in the subsequent process. In some embodiments, a third electrode 109 is formed on the semiconductor layer 107 by a non-solution process such as vacuum coating. Meanwhile, refer to FIG. 4C, by using a mask 401 to cover the portion 107A and the edge portion 107B of the semiconductor layer 107, the third electrode 109 formed on the semiconductor layer 107 is patterned; after removing the mask 401, an opening O5 and an opening O6 are formed in the third electrode 109, respectively exposing the portion 107A and the edge portion 107B of the semiconductor layer 107. In FIG. 4C, a patterned photoresist layer 402 is formed on the third electrode 109, and the patterned photoresist layer 402 has an opening O7 and an opening O8 respectively communicating with the opening O5 and the opening O6 of the third electrode. The third electrode 109 has no compatibility problems with the patterned photoresist layer 402, for example, mutual dissolution or chemical reaction, and can spatially separate the semiconductor layer 107 and the patterned photoresist layer 402, which have compatibility problems. In FIG. 4D (also refer to FIG. 4C), the portion not protected by the patterned photoresist layer 402, that is, the portion 107A of the semiconductor layer 107 in the opening O5 of the third electrode 109, is etched to form a through-hole H1. The edge portion 107B of the semiconductor layer 107 in the opening O6 of the third electrode 109 is etched to form an opening O9. The through-hole H1 and the opening O9 respectively penetrate through the third electrode 109 and the semiconductor layer 107 and expose the portion 105A of the second electrode 105 and the edge portion 101B of the substrate 101, respectively. In FIG. 4E, the patterned photoresist layer 402 in FIG. 4D is removed.

Refer to FIG. 4E, FIG. 1A, and FIG. 1B. In the embodiment shown in FIG. 4E, a conductive block 111 is deposited in the through-hole H1, and a package layer 113 is then deposited on the third electrode 109, the conductive block 111, and the edge portion 101B of the substrate 101 to obtain the electrode connection structure shown in FIG. 1A or FIG. 1B. For details of the intermediate process of depositing a conductive block 111 in the through-hole H1, please refer to FIG. 6 to FIG. 9C below. The formed conductive block 111 directly contacts the second electrode 105 and the third electrode 109 and has a good electrode connection and a feature that the first upper surface 111V and the second upper surface 109V of the third electrode are not in the same plane (as shown in FIG. 1A or FIG. 1B).

Next, the intermediate stage cross-sectional views of forming an electrode connection structure 500 of FIG. 5A to FIG. 5C will be described in detail. In FIG. 5A, a first electrode 103 and a second electrode 105 are formed on a substrate 101, and a semiconductor layer 107 is formed on the first electrode 103, the second electrode 105, and the substrate 101. refer to the above embodiments of FIG. 2A for the embodiments of FIG. 5A, which will not be repeated here.

In FIGS. 5B to 5C, a through-hole H1 is formed to penetrate through the third electrode 109 and the semiconductor layer 107 to expose the second electrode 105. In FIG. 5B, before forming the third electrode 109 on the semiconductor layer 107, it includes forming a mask 501 on the portion 107A and the edge portion 107B of the semiconductor layer 107 to respectively define the location where the conductive block 111 is deposited and filled and where the package layer 113 is deposited and filled in the subsequent process. In some embodiments, a third electrode 109 is formed on the semiconductor layer 107 by a non-solution process such as vacuum coating. A mask 501 is used to cover the portion 107A and the edge portion 107B of the semiconductor layer 107 to pattern the third electrode 109 formed on the semiconductor layer 107, and after removing the mask 501, an opening O10 and an opening O11 are formed in the third electrode 109, respectively exposing the portion 107A and the edge portion 107B of the semiconductor layer 107. In FIG. 5C, also referring to FIG. 5B, a laser 503 is used to remove the portion 107A of semiconductor layer 107 in the opening O10 of the third electrode 109 to form a through-hole H1. A laser 505 and a laser 507 are used to remove the edge portion 107B of the semiconductor layer 107 in the opening O11 of the third electrode 109 to form an opening O12. Using laser lift-off can avoid patterning with the photoresist layer that is incompatible with the semiconductor layer 107. It can also ensure obtaining a through-hole H1 penetrating through the third electrode 109 and the semiconductor layer 107 and aligned with the portion 105A of the second electrode 105 and obtaining an opening O12 aligned with the edge portion 101B of the substrate 101. That is to say, the through-hole H1 exposes the portion 105A of the second electrode 105, and the opening O12 exposes the edge portion 101B of the substrate 101.

Refer to FIG. 5C, FIG. 1A, and FIG. 1B. In the embodiment shown in FIG. 5C, a conductive block 111 is deposited in the through-hole H1, and a package layer 113 is deposited on the third electrode 109, the conductive block 111, and the edge portion 101B of the substrate 101 to obtain the electrode connection structure shown in FIG. 1A or FIG. 1B. For details of the intermediate process of depositing a conductive block 111 in the through-hole H1, please refer to FIG. 6 to FIG. 9C below. The formed conductive block 111 directly contacts the second electrode 105 and the third electrode 109 and has a good electrode connection and a feature that the first upper surface 111V and the second upper surface 109V of the third electrode are not in the same plane (as shown in FIG. 1A or FIG. 1B).

Figure 6:
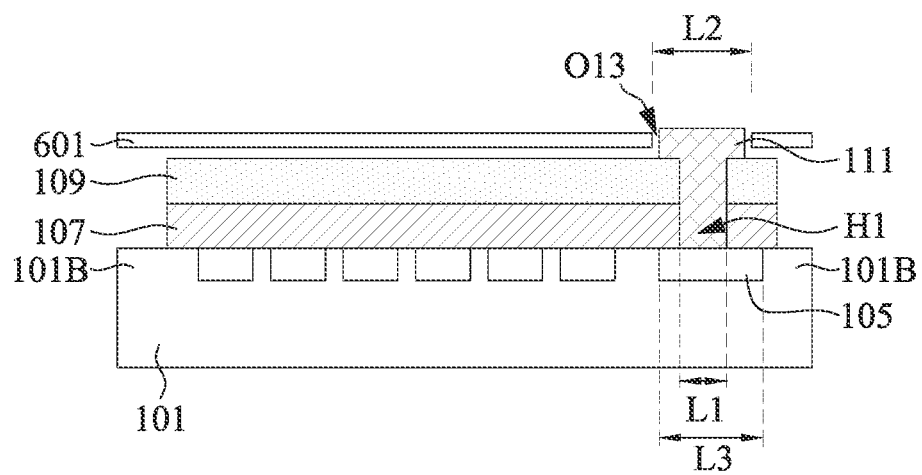
FIG. 6 is a cross-sectional view of an intermediate stage in depositing a conductive block in the through-hole according to some embodiments of the present disclosure.
Figure 7:
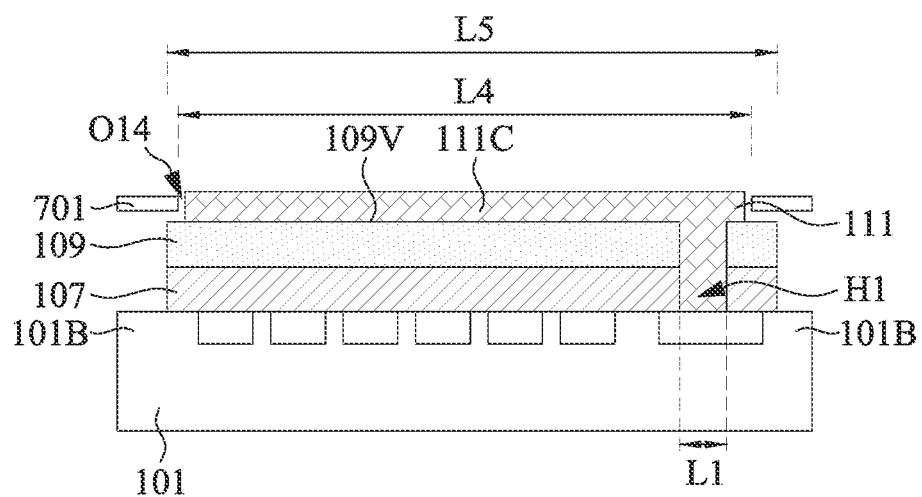
FIG. 7 is a cross-sectional view of an intermediate stage in depositing a conductive block in the through-hole according to some embodiments of the present disclosure.
Figure 8A:
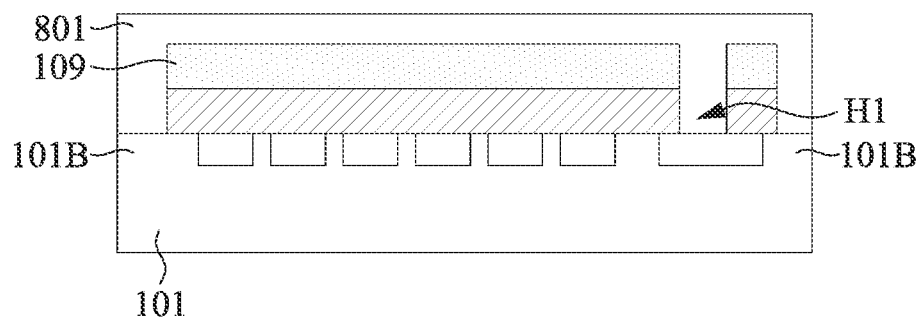
FIGS. 8A-8C are cross-sectional views of intermediate stages of depositing a conductive block in the through-hole according to some embodiments of the present disclosure.
Figure 8B:
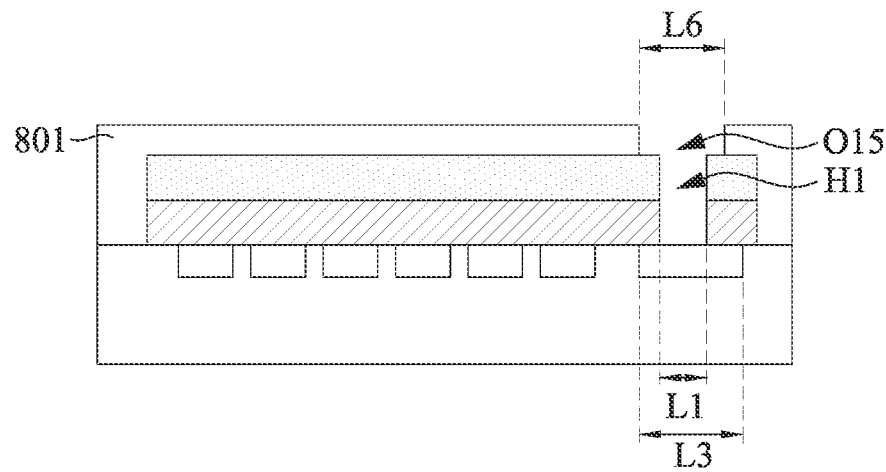
Figure 8C:
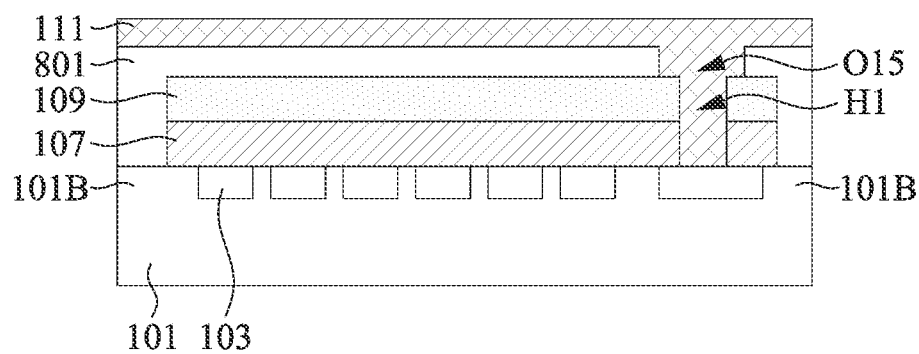
Figure 9A:
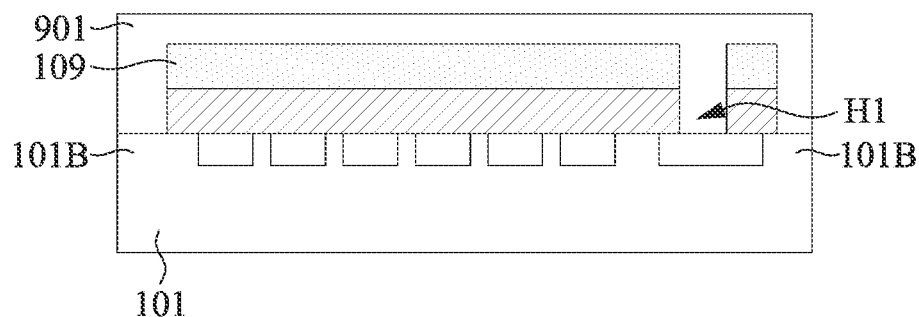
FIGS. 9A to 9C are cross-sectional views of intermediate stages of depositing a conductive block in the through-hole according to some embodiments of the present disclosure.
Figure 9B:
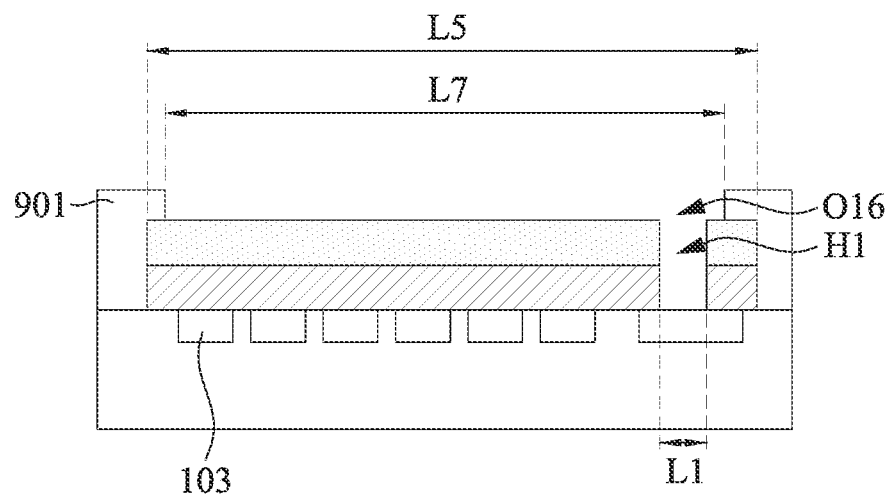
Figure 9C:
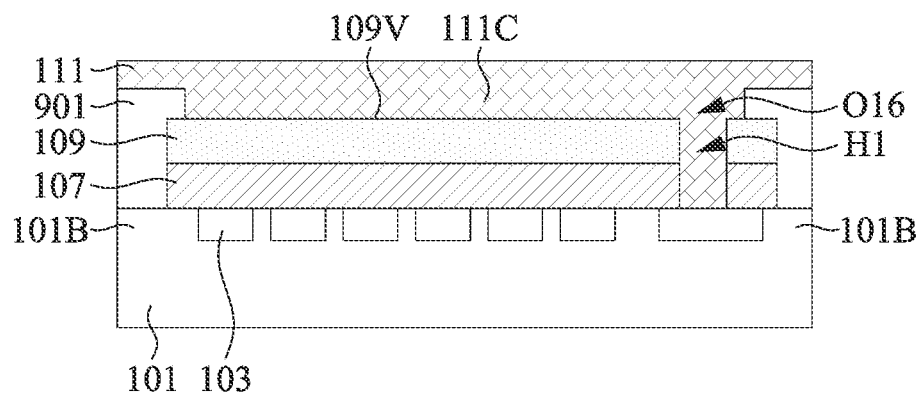

FIG. 6 is a cross-sectional view of an intermediate stage of depositing a conductive block in the through-hole according to the method in some embodiments of the present disclosure. FIG. 7 is a cross-sectional view of an intermediate stage of depositing a conductive block in the through-hole according to the method in some embodiments of the present disclosure. FIGS. 8A-8C are cross-sectional views of intermediate stages of depositing a conductive block in the through-hole according to the method in some embodiments of the present disclosure. FIGS. 9A-9C are cross-sectional views of intermediate stages of depositing a conductive block in the through-hole according to the method in some embodiments of the present disclosure. The final electrode connection structure such as the one shown in FIG. 1A or FIG. 1B can be obtained from the electrode connection structure 200 of FIG. 2E, the electrode connection structure 300 of FIG. 3B, the electrode connection structure 400 of FIG. 4E, and the electrode connection structure 500 of FIG. 5C by the above methods of depositing a conductive block in the through-hole, for example, the methods of FIG. 6, FIG. 7, FIGS. 8A-8C, or FIGS. 9A-9C.

Next, the method of depositing a conductive block 111 in the through-hole H1 of FIG. 6 will be described in detail. In FIG. 6, a mask 601 is formed on the third electrode 109. The mask 601 has an opening O13 exposing the through-hole H1. The hole diameter L2 of the opening O13 is larger than the hole diameter L1 of the through-hole H1 and smaller than a width L3 of the second electrode 105, so the through-hole H1 can be completely filled when deposited with the conductive block 111. Moreover, in the embodiment where the conductive block 111 is not formed of a transparent material, it can prevent the conductive block 111 from blocking the light emission when the light emits from the semiconductor layer 107 toward the third electrode 109. After depositing the conductive block 111 in the through-hole H1, the mask 601 is removed, and the package layer 113 is subsequently formed on the third electrode 109, the conductive block 111, and the edge portion 101B of the substrate 101 to obtain the electrode connection structure as shown in FIG. 1A.

Next, the method of depositing a conductive block 111 in the through-hole H1 of FIG. 7 will be described in detail. In FIG. 7, a mask 701 is formed on the third electrode 109. The mask 701 has an opening O14 exposing the through-hole H1. The hole diameter L4 of the opening O14 is larger than the hole diameter L1 of the through-hole H1, located above the first electrode 103, and smaller than the width L5 of the third electrode 109. The conductive block 111 not only completely fills the through-hole H1 when it is deposited in the through-hole H1 but also has an extended portion 111C covering the second upper surface 109V of the third electrode 109, thereby increasing the contact area with the third electrode 109 and reducing resistance. After depositing the conductive block 111 in the through-hole H1, the mask 701 is removed, and a package layer 113 is formed on the third electrode 109, the conductive block 111, and the edge portion 101B of the substrate 101 to obtain the electrode connection structure as shown in FIG. 1B.

Next, the method of depositing a conductive block 111 in the through-hole H1 of FIG. 8A to FIG. 8C will be described in detail. In FIG. 8A, a photoresist layer 801 is formed on the third electrode 109, in the through-hole H1, and on the edge portion 101B of the substrate 101. Next, in FIG. 8B, the photoresist layer 801 is patterned to form an opening O15 to expose the through-hole H1. The opening O15 defines the position of the conductive block 111 in the final electrode connection structure. The hole diameter L6 of the opening O15 is larger than the hole diameter L1 of the through-hole H1 and smaller than the width L3 of the second electrode 105. Thus, the conductive block 111 can completely fill the through-hole H1 when deposited in the opening O15 in the subsequent process referring to FIG. 8C, and when the conductive block 111 is deposited outside the opening O15, the photoresist layer 801 is interposed between the conductive block 111 and the third electrodes 109 below to benefit the removal of the conductive block 111 outside the opening O15 when the photoresist layer 801 is removed in the subsequent process. That is to say, the electrode connection structure finally obtained only has the conductive block 111 inside the opening O15 and does not have the conductive block 111 outside the opening O15 (e.g., on the first electrode 103). Continuing to refer to FIG. 8C, the conductive block 111 is deposited in the through-hole H1 and on the photoresist layer 801. The photoresist layer 801 is removed together with the conductive block 111 on the photoresist layer to obtain the conductive block 111 that is only located in the opening O15, and a package layer 113 is subsequently formed on the third electrode 109, the conductive block 111, and the edge portion 101B of the substrate 101 to obtain the electrode connection structure as shown in FIG. 1A.

Next, the method of depositing a conductive block 111 in the through-hole H1 of FIG. 9A to FIG. 9C will be described in detail. In FIG. 9A, a photoresist layer 901 is formed on the third electrode 109, in the through-hole H1, and on the edge portion 101B of the substrate 101. Next, in FIG. 9B, the photoresist layer 901 is patterned to form an opening O16 to expose the through-hole H1. The opening O16 defines the position of the conductive block 111 in the final electrode connection structure. The hole diameter L7 of the opening O16 is larger than the hole diameter L1 of the through-hole H1, located above the first electrode 103, and smaller than the width L5 of the third electrode 109. The conductive block 111 can completely fill the through-hole H1 when deposited in the opening O16 in the subsequent process referring to FIG. 9C, and the conductive block 111 has an extended portion 111C covering the second upper surface 109V of the third electrode 109. When the conductive block 111 is deposited outside the opening O16, the photoresist layer 901 is interposed between the conductive block 111 and the edge portion 101B of the substrate 101 below. That is to say, the finally obtained electrode connection structure has not only the conductive block 111 located in the through-hole H1 but also the extended portion 111C located on the first electrode 103. Continuing to refer to FIG. 9C, the conductive block 111 is deposited in the through-hole H1 and on the photoresist layer 901. Then, the photoresist layer 901 is removed together with the conductive block 111 on the photoresist layer 901 to obtain the conductive block 111 that is only located in the opening O16, next, a package layer 113 is formed on the third electrode 109, the conductive block 111, and the edge portion 101B of the substrate 101 to obtain the electrode connection structure as shown in FIG. 1B.

The above methods of forming an electrode connection structure prevent the semiconductor layer 107 (which can only be coated on the electrode connection structure by the solution-type process) from directly contacting the chemicals used in the lithography process. That is to say, the above methods prevent the semiconductor layer 107 from contacting the chemicals used in the lithography process, which results in incompatibility problems due to material characteristics, such as mutual dissolution or chemical reaction. A patterned semiconductor layer 107 can be obtained so that the conductive block 111 and the portion 105A of the second electrode 105 are well connected (meaning that there is substantially no semiconductor layer 107 between the conductive block 111 and the portion 105A of the second electrode 105). The package layer 113 is also in good contact with the edge portion 101B of the substrate 101 (meaning that there is substantially no semiconductor layer 107 between the package layer 113 and the edge portion 101B of the substrate 101). The electrode connection structure also has the above characteristics after miniaturization. In addition, since the third electrode 109 is patterned first and then the conductive block 111 is deposited in the present disclosure, the conductive block 111 and the third electrode 109 are not integrally formed. The two can not only be formed of the same materials, but also different materials, and have a feature that, for example, the first upper surface 111V of the conductive block 111 and the second upper surface 109V of the third electrode 109 are not in the same plane.

The present disclosure has described features of some embodiments to enable those of ordinary skill in the art to better understand the presently disclosed aspects. Those of ordinary skill in the art should recognize that they may at any time utilize the present disclosure as a basis for designing or modifying other processes and structures for carrying out the same purposes and/or achieving the same advantages of the embodiments presented herein. Those of ordinary skill in the art should also recognize that such equivalent constructions do not depart from the spirit and scope of the present disclosure, and that they can make various changes, substitutions and modifications herein without departing from the spirit and scope of the present disclosure.

What is claimed is:

1. An electrode connection structure, comprising:
   a substrate;
   a first electrode and a second electrode located on the substrate;
   a semiconductor layer located on the first electrode and the second electrode;
   a third electrode located on the semiconductor layer; and
   a conductive block penetrating through the semiconductor layer and the third electrode and directly contacting the second electrode and the third electrode, wherein a first upper surface of the conductive block and a second upper surface of the third electrode are in different planes.

2. The electrode connection structure of claim 1, wherein the conductive block further comprises an extended portion covering the second upper surface of the third electrode.

3. The electrode connection structure of claim 1, wherein the semiconductor layer comprises a photoactive layer, a carrier transport layer, or a combination thereof, and a material of the photoactive layer comprises an organic semiconductor, a quantum dot, a perovskite, or combinations thereof.

4. The electrode connection structure of claim 1, wherein the first upper surface of the conductive block is higher than the second upper surface of the third electrode.

5. The electrode connection structure of claim 1, wherein a material of the conductive block is the same as a material of the third electrode.

6. The electrode connection structure of claim 1, wherein a material of the conductive block is different from a material of the third electrode.

7. The electrode connection structure of claim 1, further comprising a package layer disposed on the third electrode, the conductive block, and an edge portion of the substrate to completely cover the third electrode, the conductive block, and the semiconductor layer.

8. A method of forming an electrode connection structure, comprising:
   forming a first electrode and a second electrode on a substrate;
   forming a semiconductor layer on the first electrode and the second electrode;
   forming a third electrode on the semiconductor layer;
   forming a through-hole penetrating through the third electrode and the semiconductor layer to expose the second electrode; and
   depositing a conductive block in the through-hole, wherein the conductive block directly contacts the second electrode and the third electrode, and a first upper surface of the conductive block and a second upper surface of the third electrode are in different planes.

9. The method of claim 8, wherein forming the through-hole penetrating through the third electrode and the semiconductor layer to expose the second electrode comprises:
   forming a photoresist layer on the third electrode;
   patterning the photoresist layer to form an opening exposing the third electrode;
   etching the third electrode in the opening and the semiconductor layer below the third electrode to form the through-hole; and
   removing the photoresist layer.

10. The method of claim 8, wherein forming the through-hole penetrating through the third electrode and the semiconductor layer to expose the second electrode comprises:
removing a portion of the third electrode and a portion of the semiconductor layer with a laser to form the through-hole.

11. The method of claim 8, further comprising before forming the third electrode on the semiconductor layer,
forming a mask on a portion of the semiconductor layer, wherein forming the through-hole penetrating through the third electrode and the semiconductor layer to expose the second electrode comprises:
removing the mask, wherein the third electrode has an opening exposing the portion of the semiconductor layer;
forming a patterned photoresist layer on the third electrode, the patterned photoresist layer having an opening communicating with the opening of the third electrode;
etching or striping the portion of the semiconductor layer in the opening of the third electrode to form the through-hole; and
removing the patterned photoresist layer.

12. The method of claim 8, further comprising before forming the third electrode on the semiconductor layer,
forming a mask on a portion of the semiconductor layer, wherein forming the through-hole penetrating through the third electrode and the semiconductor layer to expose the second electrode comprises:
removing the mask, wherein the third electrode has an opening exposing the portion of the semiconductor layer; and
removing the portion of the semiconductor layer in the opening of the third electrode with a laser to form the through-hole.

13. The method of claim 8, wherein depositing the conductive block in the through-hole comprises:
forming a mask on the third electrode, the mask having an opening exposing the through-hole;
depositing the conductive block in the through-hole; and
removing the mask.

14. The method of claim 8, wherein depositing the conductive block in the through-hole comprises:
forming a photoresist layer on the third electrode and in the through-hole;
patterning the photoresist layer to form an opening exposing the through-hole;
depositing the conductive block in the through-hole; and
removing the photoresist layer.

15. The method of claim 8, wherein the semiconductor layer comprises a photoactive layer, a carrier transport layer, or a combination thereof, and a material of the photoactive layer comprises an organic semiconductor, a quantum dot, a perovskite, or combinations thereof.

* * * * *